United States Patent
Agrawal et al.

(10) Patent No.: US 6,861,868 B1
(45) Date of Patent: *Mar. 1, 2005

(54) HIGH SPEED INTERFACE FOR A PROGRAMMABLE INTERCONNECT CIRCUIT

(75) Inventors: Om P. Agrawal, Los Altos, CA (US); Jinghui Zhu, San Jose, CA (US); Kuang Chi, San Jose, CA (US); ChienKuang Chen, Sunnyvale, CA (US)

(73) Assignee: Lattice Semiconductor Corp., Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/463,781

(22) Filed: Jun. 16, 2003

Related U.S. Application Data

(63) Continuation of application No. 10/023,226, filed on Dec. 14, 2001, now Pat. No. 6,650,141.

(51) Int. Cl.[7] .......................................... H03K 19/173
(52) U.S. Cl. .............................. 326/38; 326/39; 326/41
(58) Field of Search .............................. 326/38, 41, 37, 326/42, 39, 40

(56) References Cited

U.S. PATENT DOCUMENTS

| | | | |
|---|---|---|---|
| 5,457,644 A | * | 10/1995 | McCollum ................... 326/41 |
| 5,838,628 A | | 11/1998 | Cliff et al. |
| 6,011,407 A | | 1/2000 | New |
| 6,031,428 A | | 2/2000 | Hill |
| 6,034,541 A | | 3/2000 | Kopec, Jr. et al. |
| 6,104,207 A | | 8/2000 | Chan et al. |
| 6,650,141 B2 | * | 11/2003 | Agrawal et al. ............... 326/41 |
| 2001/0033188 A1 | | 10/2001 | Aung |
| 2002/0190751 A1 | | 12/2002 | Lee |

OTHER PUBLICATIONS

U.S. Appl. No. 10/023,226, Agrawal, filed Jun. 19, 2003.

Konstas. Jason. "Converting Wide, Parallel Data Buses to High Speed Serial Link," International IC '99 Conf. Proceedings, (Apr. 1999).

* cited by examiner

*Primary Examiner*—Michael Tokar
*Assistant Examiner*—Lam T. Mai

(57) ABSTRACT

A programmable semiconductor device comprising a plurality of I/O circuits arranged into blocks includes a routing structure for each block, wherein each routing structure may programmably route signals between its block's I/O circuits and the I/O circuits within the remaining blocks. Each I/O circuit associates with a pin such that each block has a set of pins. A SERDES and a FIFO buffer associate with each block. Each block's SERDES couples between the block's I/O circuits and the block's set of pins. Each FIFO buffer couples between the SERDES and its block's I/O circuits.

20 Claims, 12 Drawing Sheets

HIGH SPEED INTERFACE FOR A PROGRAMMABLE INTERCONNECT CIRCUIT

RELATED APPLICATION DATA

This application is a continuation of application Ser. No. 10/023,226, filed Dec. 14, 2001, now U.S. Pat. No. 6,650,141.

This application is related to U.S. applications "Multi-level Routing Structure for a Programmable Interconnect Circuit," application. Ser. No. 10/023,053; "I/O Block for a Programmable Interconnect Circuit," application. Ser. No. 10/021,844; "Block-Oriented Architecture For A Programmable Interconnect Circuit," application. Ser. No. 10/022,464; and "Programmable Interconnect Circuit with a Phase-Locked Loop," application. Ser. No. 10/021,873, the contents of which are hereby incorporated by reference in their entirety.

FIELD OF THE INVENTION

This invention relates generally to programmable semiconductor circuits, and more particularly to the input and output of data through such a circuit.

DESCRIPTION OF RELATED ART

In-system-programmable interconnect devices permit a user to programmably route signals between pins of the device. For example, Lattice Semiconductor Corp. currently manufactures an ispGDX® family of programmable interconnect devices having a non-volatile E$^2$CMOS® in-system-programmable crossbar switch matrix for programmable switching, interconnect, and jumper functions. Each pin of the ispGDX® device is associated with an input/output (I/O) circuit that programmably couples to other I/O circuits through a routing structure denoted as a global routing pool (GRP). The I/O circuits contain registers allowing the input and output signals on the associated pins to be selectively registered.

Referring now to FIG. 1, an input/output circuit 10 for an ispGDX® device couples to a 4:1 multiplexer (Mux) 12 that receives signals A, B, C, and D from four different routing structures, GRP_A, GRP_B, GRP_C, and GRP_D, (not illustrated) respectively. Each routing structure corresponds to a given quadrant (a side of the integrated circuit) for the device. Accordingly, GRP_A receives the input signals from I/O pins 20 in quadrant A, GRP_B receives the input signals from I/O pins 20 in quadrant B, and so on. Input/output circuit 10 receives its input signals from its pin 20 and directs them to the appropriate global routing structure on path 19. For example, if I/O circuit 10 is within quadrant A, path 19 would couple to GRP_A.

Each routing structure is a switch matrix that may receive input signals from selected I/O circuits 10 and programmably route output signals to all I/O circuits 10. For clarity, the individual routing structures are grouped together and jointly designated by a single routing structure 14. A similar device or circuit is disclosed in U.S. Pat. No. 6,034,541, the contents of which are hereby incorporated by reference in their entirety.

In addition, each global routing pool has a switch matrix fused by an in-system-programmable non-volatile E$^2$CMOS® memory bank, configured for one-way routability. A given memory cell in the volatile E$^2$CMOS® memory bank controls the state of a "fuse point" in the switch matrix. The fuse point may be formed by, e.g., a pass transistor that will programmably connect an input lead of the switch matrix to an output lead of the switch matrix, depending upon the logical state (high or low) of the fuse point's memory cell. I/O pins 20 to the device are arranged in quadrants (the four sides to the chip) such that an individual routing structure receives signals from the I/O circuits 10 in a single quadrant and may distribute these signals to the I/O circuits 10 in all four quadrants. Thus, the four input signals A, B, C, and D for each Mux 12 are "quadrant" limited to originate in their respective quadrants. Note that, with respect to routing structure 14, each I/O circuit 10 is independent and separate from the remaining I/O circuits 10. Because routing structure 14 distributes signals independently to each I/O circuit 10, the resulting arrangement may be denoted as "pin-oriented" or "bit-oriented" in that each I/O circuit 10 associates with a single I/O pin 20.

Although this "bit-oriented" architecture allowed a user to programmably interconnect signals through the device, the number of fuses in the resulting global routing pool becomes prohibitive as the pin count increases. However, modern board density continues to increase, demanding an interconnect device having a suitable number of pins to interconnect the signals. Moreover, interconnect devices may be used to route signals in a backplanes for telecommunication applications where ever-increasing bandwidth and throughput requirements require increased pin counts. At the gigabit transmission rate of these applications, parallel data transmission suffers from co-channel interference and EMI effects.

To solve the problems associated with high-speed parallel data transmission, parallel data may be serialized before transmission and then de-serialized upon reception using serial transmission protocols such as a low voltage differential signaling protocol (LVDS). LVDS uses high-speed circuit techniques to provide multi-gigabit data transfers on copper interconnects and is a generic interface standard for high-speed data transmission. LVDS system features, such as synchronizing data, encoding the clock and low skew, all work together for higher performance. Skew is a big problem for sending parallel data and its clock across cables or PCB traces because the phase relation of the data and clock can be lost as a result of different travel times through the link. However, the ability to serialize parallel data into a high-speed signal with embedded clock eliminates the skew problem. The problem disappears because the clock travels with the data over the same differential pair of wires. The receiver uses a clock and data recovery circuit to extract the embedded-phase-aligned clock from the data stream. However, many serial bit streams will have periods of consecutive zeroes or ones. Because bit transitions are absent, the clock recovery component loses or cannot recover the clock during these periods. As a result, LVDS systems typically introduce data coding to ensure a suitable rate of bit transitions. For example, in a 8B/10B LVDS system, eight bits of data are encoded into a ten bit codeword, ensuring that the clock recovery component recovers the embedded clock signal. The recovered clock is then used by a data recovery component to identify the bits in the transmitted codeword.

To permit the transition between parallel and serial data transmission, serializer/deserializer (SERDES) units are incorporated at both the transmitting and receiving ends of the serial data stream. In addition, because the clock is encoded into the serial data stream, it will be incoherent to the system clock for the receiving end, necessitating a first-in-first-out (FIFO) buffer to accommodate the asynchronous reading and writing clocks.

Accordingly, there is a need in the art for an improved programmable interconnect device specialized for bus-switching applications and provides serializer/deserializer, clock data recovery, and FIFO capabilities to permit high speed serial signaling.

SUMMARY

In accordance with one aspect of the invention, a programmable semiconductor circuit includes a plurality of I/O circuits arranged into I/O blocks. Each I/O block has its own routing structure programmably coupling input signals from all the I/O circuits to the block's I/O cells. In this fashion, an I/O circuit in a given I/O block may programmably receive I/O signals from or transmit I/O signals to the I/O circuits in all the I/O blocks. The routing structure programmably routes the I/O signals according to configuration data stored in a memory device that may be in-system programmable. Each I/O circuit associates with a pin such that each I/O block has a set of pins corresponding to its I/O cells. Each I/O block associates with a serializer/deserializer (SERDES) coupled between its I/O block and the I/O block's set of I/O pins. In addition, a first-in, first-out (FIFO) buffer couples between the SERDES and its I/O block, the SERDES being operable to recover an embedded clock signal from a serial stream of data signals coupled from a first subset of pins within the I/O block's set of pins and to convert the serial data stream into a parallel data stream using the recovered clock signal, the FIFO buffer being operable to receive the parallel data stream from the SERDES and to route the parallel data stream to I/O circuits within its I/O block.

The invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION

Figure 2:
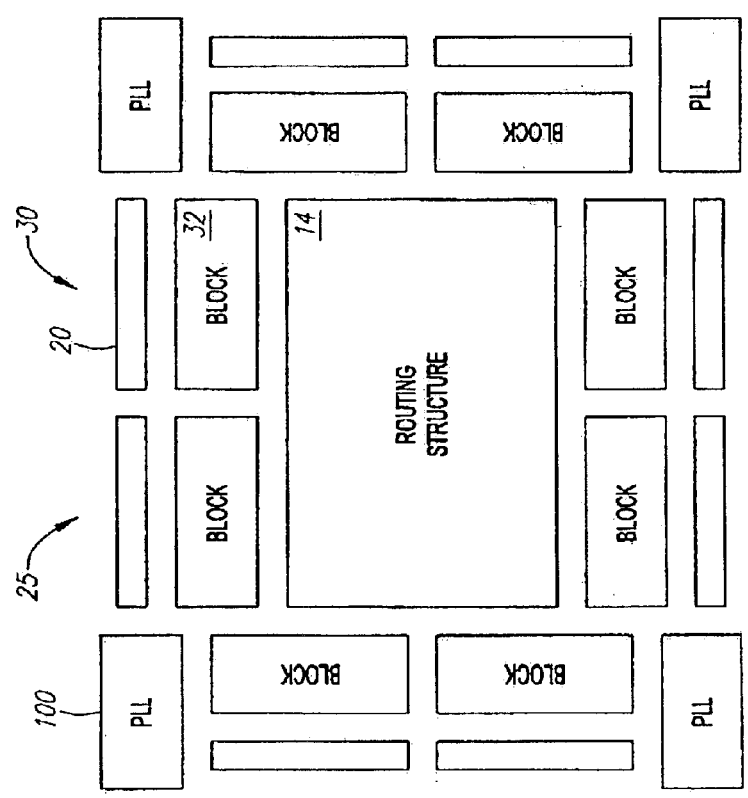
FIG. 2 illustrates a block-oriented programmable interconnect circuit having a plurality of serial interfaces according to one embodiment of the invention.
Figure 3:
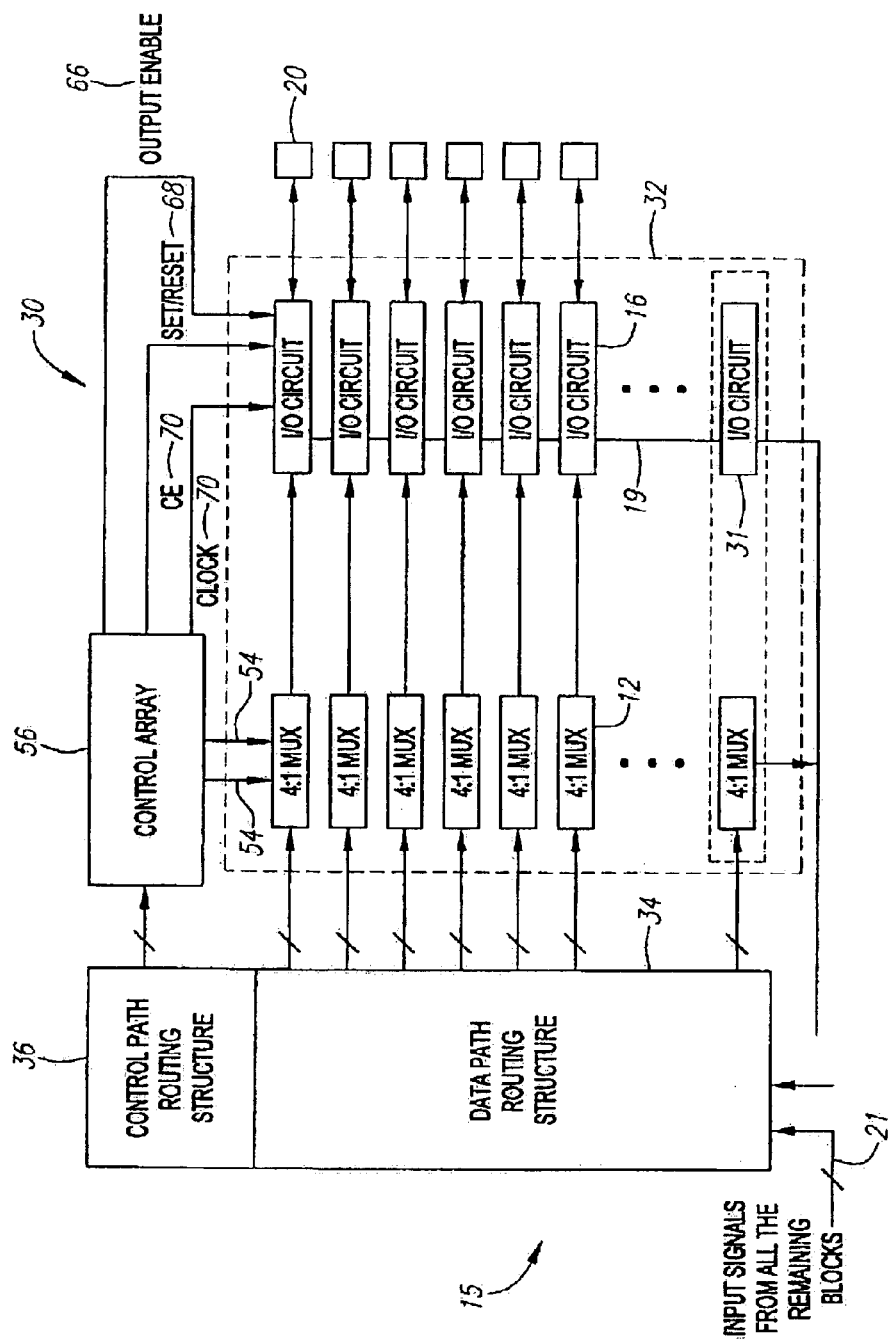
FIG. 3 illustrates the relationship of an I/O block to its serial interface and routing structure according to one embodiment of the invention.

Referring now to FIGS. 2 and 3, a programmable interconnect device 25 having a "block-oriented" architecture 30 is illustrated. In contrast to the "bit-oriented" architecture of the prior art, the I/O circuits 16 (FIG. 3) are arranged in I/O blocks 32 such that each block 32 having a plurality X of I/O circuits 16 associates with its own routing structure 15 (FIG. 3). In general, X is arbitrary as any number of I/O circuits 16 may be assigned to an I/O block 32. However, because bus-switching applications typically route binary signals in groups of 8 (one byte) or 16 (two bytes), assigning 16 I/O circuits per I/O block 32 is particularly convenient. It will be appreciated, however, that other numbers of I/O circuits per I/O block may be used, for example, 4 or 8. Each I/O circuit 16 may be contained within an I/O cell 31, which also includes a 4:1 MUX 12 for selecting data signal inputs for I/O circuit 16. In FIG. 2, the routing structures 15 are collectively denoted as a single routing structure 14 for clarity. Referring again to FIG. 3, each I/O circuit 16 may receive input signals from its pin 20. These input signals may comprise data signals that will ultimately be routed to other pins 20. Alternatively, these input signals may comprise control signals for controlling, for example, multiplexers 12 or registers within I/O circuits 16.

As will be described further herein, interconnect device 25 is programmable because of its association with a programmable memory (not illustrated), which is typically non-volatile but may be implemented as a volatile memory if desired. A user would program memory elements within the programmable memory to desired logic levels. These memory elements then control programmable elements such as fuse points, multiplexers, and switches within interconnect device 25 so as to effect a desired mode of operation. The programmable memory is preferably in system programmable, such that a user may change the programming during operation of the interconnect device.

A subset of pins 20 for each block 32, for example pins 20a and 20b, may receive serial data signals such as low-voltage-differential-signaling (LVDS) signals. Other differential signaling standards that may be implemented include LVPECL, NLVDS, and BLVDS. Serial interface unit 160 couples to pins 20a and 20b to decode the differential signal and deserialize the decoded data. In the embodiment illustrated, serial interface unit 160 spans two I/O blocks 32 because each spanned I/O block pair 32 shares resources with its serial interface unit 160 to reduce component count. Alternatively, each serial interface unit 160 could span more than two I/O blocks 32 or span just one I/O block 32. Because the embodiment shown in FIG. 2 has its serial interface unit 160 spanning two I/O blocks 32, there are two serializer/deserializer (SERDES) units 165 (FIG. 3) within each serial interface unit 160, one for each I/O block 32. Should pins 20a and 20b be used for coupling serial data from an external device to an I/O block 32, SERDES unit 165, which couples to pins 20a and 20b, acts as a receiver and deserializes the received serial data. In addition, because the clock may be encoded in the serial data stream, a clock data recovery (CDR) unit (FIG. 9) within serial interface unit 160 recovers the serial data clock from the serial data stream, which is then used to identify the bits in the serial data stream so they may be deserialized. Should the serial data stream be encoded according to an 8B/10B LVDS protocol, the deserialized (parallel) data will be in the form of 10 bit codewords. If the serial data stream has a 1 GHz bit rate, the baud rate of the 10 bit codewords would be 100 MHz. An internal clock signal to interconnect device 25 may match this baud rate but will not be phase-aligned with it. Thus, serial interface 160 writes the codewords into FIFO 170. The codewords can then be read from the FIFO 170 according to the internal clock signal by a subset of I/O circuits 16 within block 32. Thus, FIFO 170 accommodates the asynchonicity between the baud rate of the parallelized codewords and the internal clock. The subset of I/O circuits 16 is determined by the length of the codeword. For example, if the codeword is 10 bits wide, 10 I/O circuits 16 would store the codeword. Should serial interface unit 160 be acting as a transmitter to transmit serialized data from its blocks 32, a PLL unit (element 190 of FIG. 9) within serial interface unit 160 synthesizes a serial data clock from the internal clock signal. Because this serial data clock will be in phase with the internal clock signal, a FIFO buffer is unnecessary to coordinate writing data from I/O circuits 16 in block 32 to its serial interface unit 160. Serial interface unit 160 transmits the serialized data to a differential signal interface (element 192 of FIG. 9) that converts the serialized data stream to a differential signal coupled to a subset of pins 20, e.g., pins 20c and 20d, which couple to the differential signal interface to receive the differential signal.

Note that the mode of operation when serial interface unit 160 couples high-speed serial data signals to and from its blocks 32 (which may be denoted as the serial mode of operation) differs from that mode (which may be denoted the parallel mode) employed when I/O circuits 16 within blocks 32 communicate lower-speed parallel data directly with their respective pins 20 without involving serial interface unit 160. In the parallel mode, each I/O circuit 16 may store an input signal from its respective pin 20. Similarly, in the parallel mode, each I/O circuit 16 may transmit an output signal to its respective pin 20. However, in the serial mode, an I/O circuit 16 may store a bit that is not from its respective pin 20 but is instead received using pins 20a and 20b. Similarly, when serial interface 160 is transmitting serialized differential data from its block's I/O circuits 16 to its block's pins 20, a given I/O circuit 16 will not transmit an output signal to its respective pin. Instead, the output differential signal is received at pins 20c and 20d.

Regardless of how I/O circuit 16 received an input signal (either directly from its pin in parallel mode operation or from its serial interface 160 in serial mode operation), the received signals may then be routed to the block's routing structure 15 on path 19. In addition, note that each block's routing structure 15 may receive input signals received on pins 20 from all the remaining blocks 32 on path 21. Paths 19 and 21 are shown separately for illustrations purposes but may be combined in an actual device. In the embodiment illustrated in FIG. 2, there are eight blocks 32, each capable of receiving input signals from its respective set of sixteen pins 20. For such an embodiment, the total number of input signals which may be received at each block's routing structure 15 is 8*16=128.

Note that each I/O block 32 may receives signals from two independent routing structures contained within routing structure 15: a data-path routing structure 34 for programmably routing data signals, and a second control-path routing structure 36 for programmably coupling control signals to a control array 56, which in turn provides product-term control signals to I/O block 32. It will be appreciated that although data-path routing structure 34 and the control-path routing structure 36 are illustrated as independent, such independence may be conceptual only in that the data-path routing structure 34 and control-path routing structure 36 may be combined into a single global routing structure. For example, a single switch matrix may accommodate both data and control signals. However, the fuse patterns within the switch matrix or global routing structure may differ according to whether data signals or control signals are being routed.

As will be explained further herein, the control array 56 associated with each I/O block 32 produces a set of product-term control signals. One set of product-term signals provides the MUX select signals 54 for the 4:1 MUXes 12. Each I/O circuit 16 may include an input register 90, an output register 92, and an output enable register 94 discussed with respect to FIG. 7. Other sets of product-term signals from the control array 56 provide the clock and clock enable (CE) signals 70, the set/reset signals 68 and the output enable (OE) signals 66 for these registers.

Figure 4:
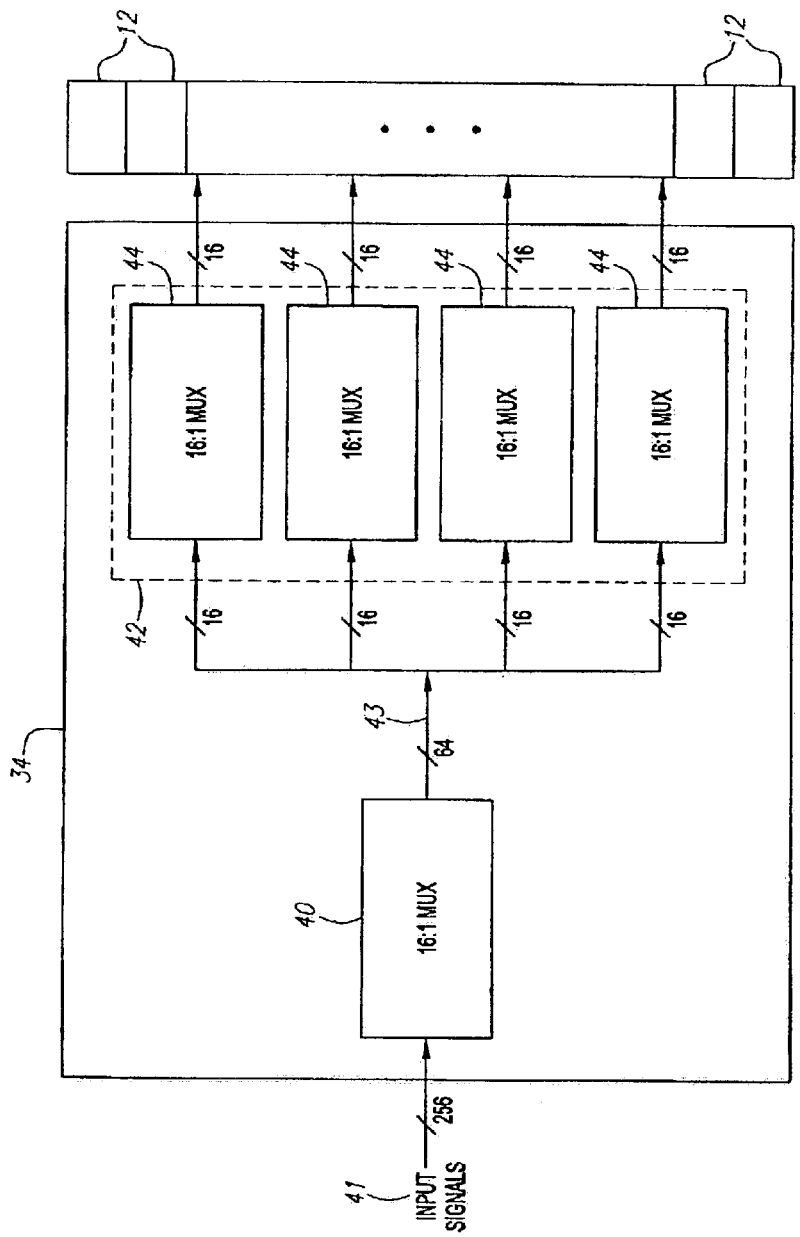
FIG. 4 illustrates a two level data-path routing structure according to one embodiment of the invention.

Arranging the I/O circuits 16 into I/O blocks 32 allows each data-path routing structure 34 and control-path routing structure 36 to be arranged in a two-level organization. The following discussion will summarize this two level organization, which is described more fully in the co-pending application entitled "Multi-Level Routing Structure for a Programmable Interconnect Circuit," concurrently filed herewith. As shown in FIG. 4, data-path routing structure 34 may comprise a first level data-path routing structure 40 and a second level data-path routing structure 42. First level data-path routing structure 40 receives input signals 41 that may originate from pins 20 corresponding to all I/O blocks 32 of the device. Each pin 20 associates with an input/output circuit 16. Thus, if there are 256 I/O circuits 16, first level data-path routing structure 40 may receive 256 input signals 41. To reduce the fuse count, first level data-path routing structure's switch matrix (not illustrated), which may be fused by a non-volatile memory bank (not illustrated), is only partially populated, thereby forming an M:1 MUX for each output signal carried on bus 43, where M corresponds to the ratio of the total number of input signals 41 feeding first level data-path routing structure 40 to the number of I/O circuits 16 within the associated I/O block 32. Accordingly, given that I/O blocks 32 each have a fixed number X of I/O cells, the total number of input signals 41 feeding first level data-path routing structure 40 becomes (N*X), where N is the total number of I/O blocks 32. M then equals (N*X)/X, which equals N, the total number of I/O blocks. Thus, the M: 1 MUX formed for each output on bus 43 of first level data-path routing structure 40 depends upon the number of I/O blocks 32 within the device. If there are sixteen I/O blocks 32, the fuse pattern within first level data-path routing structure 40 is such that it forms a 16:1 MUX for each output signal carried on bus 43. Similarly, because the 4:1 MUX 12 (FIG. 3) coupled to each I/O circuit 16 (FIG. 3) receives 4 input data signals, an I/O block 32 having sixteen I/O circuits requires 64 input data signals. In such an embodiment, first level data-path routing structure 40 will thus have a 64 bit wide output bus 43. The resulting switch matrix (not illustrated) for this embodiment of a first level data-path routing structure 40 is four-way routed in that each input signal has four different paths it may take to reach the output. In other words, an input lead to the first level data-path routing structure 40 may have four fuse points connecting it to output leads, providing the four different paths. Such a switch matrix is more fully discussed in copending "Multi-Level Routing Structure for a Programmable Interconnect Circuit," concurrently filed herewith.

Figure 1:
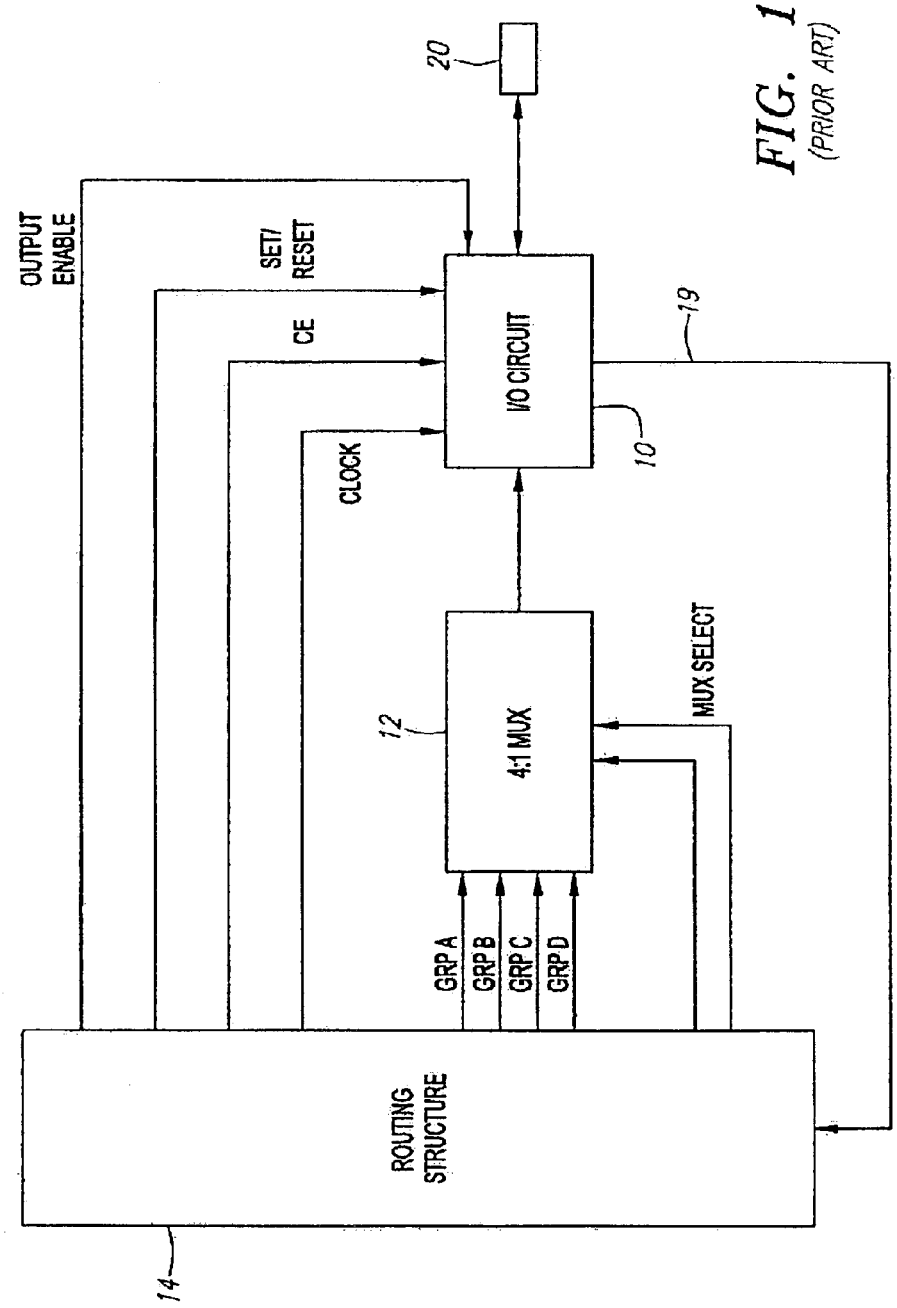
FIG. 1 illustrates a prior art programmable interconnect architecture.

To permit increased flexibility in signal routing to any given 4:1 Mux 12 within I/O block 32 associated with first level data-path routing structure 40, a second level data-path routing structure 42 couples the first level data-path routing structure 40 to the I/O block 32. The switch matrix (not illustrated) for the second level data-path routing structure 42 may be fully populated to provide this increased flexibility. This switch matrix may be fused by a non-volatile, in-system-programmable, memory bank. Second level data-path routing structure 42 may be conceptually organized into groups of X signals corresponding to the number X of I/O circuits 16 assigned to any given I/O block 32. For an X=16 architecture, the resulting second level data-path routing structure 42 is organized into four blocks 44, each corresponding to a consecutive group of 16 signals on bus 43 from first level data-path routing structure 40. Each block 44 provides 16 signals to drive four 4:1 MUXes 12. Thus, each block 44 receives 16 signals and programmably routes these signals into 16 output signals. Because any particular one of the received 16 signals may be routed to become any particular one of the 16 output signals, block 44 forms a 16:1 Mux for each of the 16 output signals. These 16 output signals become the input signals for four 4:1 multiplexers 12 within the I/O block 32 associated with the particular data-path routing structure 34. Note that the 16 input signals for each block 44 (provided by the first level data-path routing structure 40) are derived from any 16 of the 256 input signals. Because the block 44 in the second level data-path routing structure 42 receiving these 16 signals has a fully-populated switch matrix, the four inputs for any given 4:1 Mux 12 can come from any of the 256 input signals. This routing is advantageous over the prior art architecture discussed with respect to FIG. 1. The inputs to the 4:1 Mux 12 (FIG. 3) are no longer "quadrant" restricted, in that the four inputs to each 4:1 Mux 12 can come from one side, two sides, three sides, or all four sides of the device. In addition to removing the quadrant restriction of the prior art, the two level organization for data-path routing structure 34 provides a significant reduction in fuse count.

Figure 5:
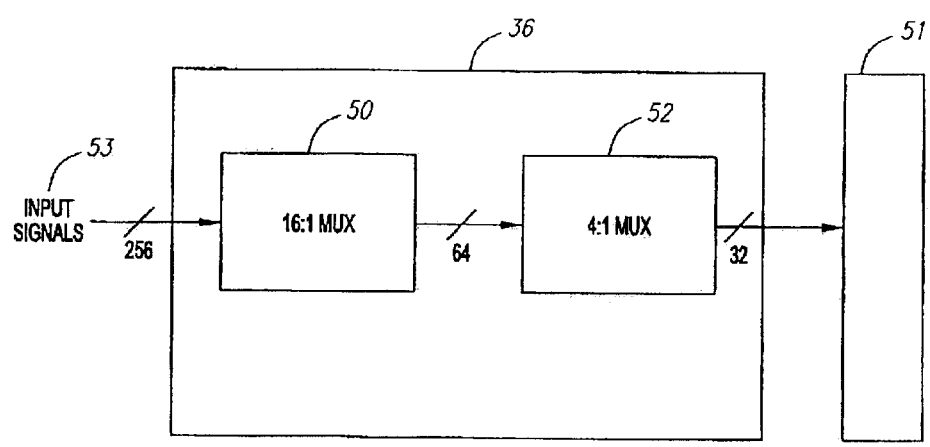
FIG. 5 illustrates a two level control-path routing structure according to one embodiment of the invention.

A similar two-level organization may be used for the control-path routing structure 36. Thus, control path routing structure 36 may comprise a first level control-path routing structure 50 and a second level control-path routing structure 52. As shown in FIG. 5, for a device having 256 I/O circuits 16, a first level control-path routing structure 50 may receive 256 input signals 53. The switch matrix (not illustrated) is fused such that each output of the first level control path routing structure 50 forms an M:1 Mux corresponding to the total number of I/O blocks 32 as discussed with respect to the first level data-path routing structure 40. In the embodiment illustrated in FIG. 5, the number of I/O blocks 32 (FIG. 3) equals 16 such that the first level control-path routing structure 50 forms a 16:1 Mux for each of its 64 output signals. Thus, the first level control-path routing structure 50 may have a similar fuse pattern to that used for the first level data-path routing structure 40.

However, unlike certain embodiments of second level data-path routing structure 42, there is no need for the second level control-path routing structure 52 to have a fully-populated switch matrix, if an assumption is made about the use of the resulting device. For example, consider the Mux select signals 54 (FIG. 3) required to control the set of 4:1 multiplexers 12 for each I/O block 32. Because each Mux 12 requires two Mux select signals 54, a fully independent Mux control structure would require 32 independent Mux select signals 54. However, in many applications such as bus switching, this level of independence would be wasted because the signals within a given bus are not switched independently and thus would not require independent Mux select signals. Grouping control signals permits the second level control-path routing structure 52 to have a partially-populated switch matrix (not illustrated) fused such that it forms a 4:1 Mux for each of 32 output signals. It will be appreciated that the number of output signals is arbitrary and results from a trade-off between fuse count and flexibility. These same design considerations control whether the second level control-path routing structure 52 has a fully or partially-populated switch matrix. Additional details and structure for the two-level data-path routing structure and control-path routing structure are described in co-pending U.S. application, "Multi-Level Global Routing Pool Structure for a Programmable Interconnect Circuit," concurrently filed herewith.

Figure 6:
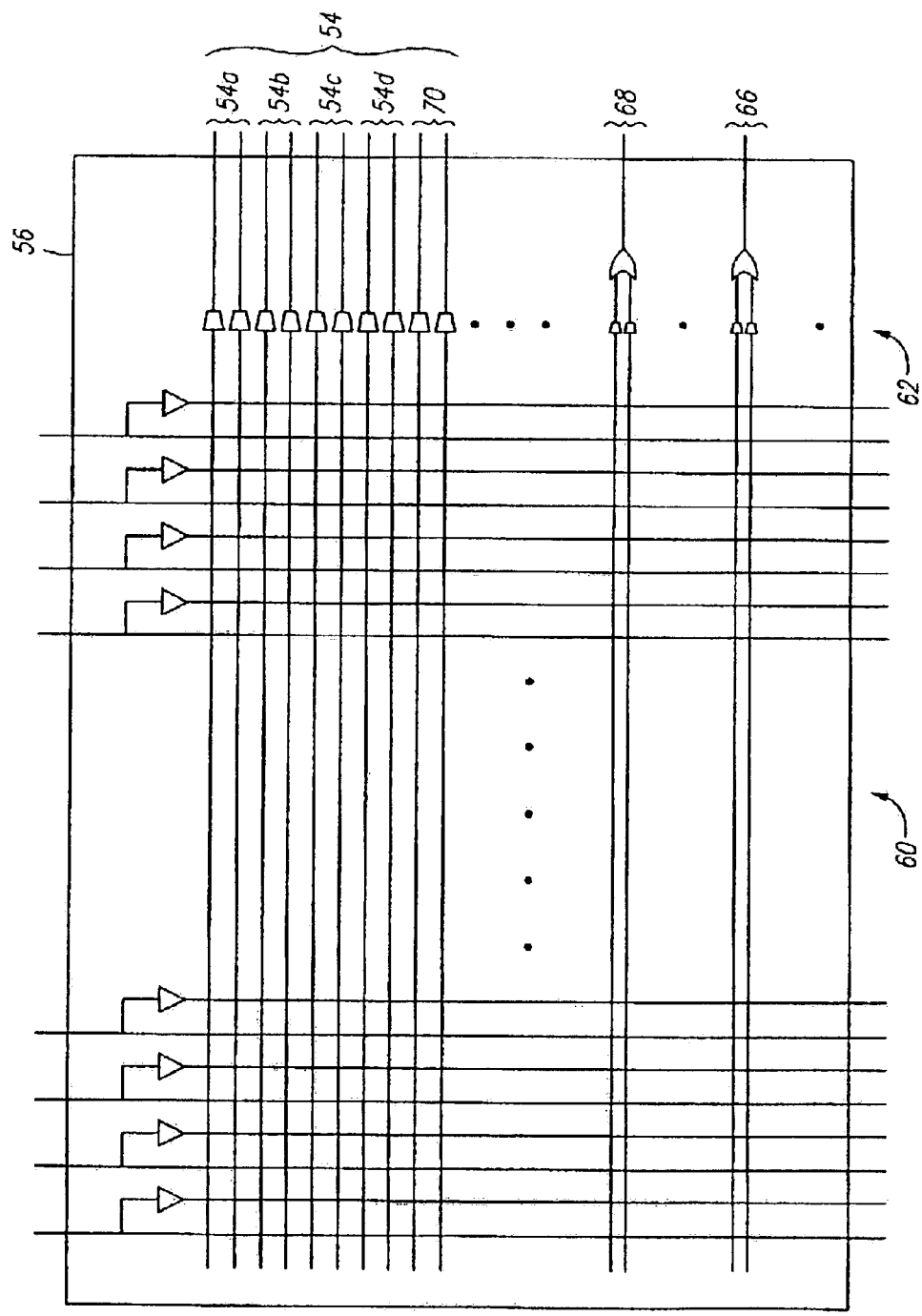
FIG. 6 illustrates a control array for generating product-term control signals according to one embodiment of the invention.

To generate independent control functions for the control signals developed by the control-path routing structure 36, the control array 56 within I/O block 32 (FIG. 3) has an AND array 60 to form product-terms 62 as illustrated in FIG. 6. The control array receives both the true and complement of the outputs from the second level control-path routing structure 52 (illustrated in FIG. 5). For an embodiment having 32 output signals from the second-level control-path routing structure 52, AND array 60 thus receives 64 signals. The number of product terms 62 derived from the AND array 60 depends upon the balance desired between fuse count and flexibility, just as discussed with respect to the second level control-path routing structure 52. In other words, increasing the number of product term outputs from the AND array 60 will increase the flexibility in the control options available to the user. However, increasing the number of product term outputs will increase the required number of fuses, increasing costs. As shown in FIG. 3, desired control signals include the Mux selects 54 for the 4:1 multiplexers 12, output enable signals (OE) 66, set/resets 68, clock and clock enable (CE) signals 70. In the embodiment illustrated in FIG. 6, AND array 60 produces 20 control signals: 8 product-term Mux selects 54, four product-term clock/clock enable signals 70, four product-term set/resets 68, and four product-term OE signals 66. It will be appreciated that the actual number of each type of product-term control signal produced by the AND array 60 is arbitrary and is driven by a tradeoff between fuse count and control function flexibility. Further details of the control functions provided by the AND array 60 are described in copending U.S. application "I/O Block for a Programmable Interconnect Circuit," concurrently filed herewith. Because each 4:1 Mux 12 (FIG. 3) in an I/O cell 31 requires two Mux select signals, a fully independent control of all 16 multiplexers 12 within I/O block 32 of FIG. 3 requires 32 Mux select signals. However, as discussed with respect to the second level control-path routing structure 52 of FIG. 5, control signals may be shared between I/O cells 31 within an I/O block 32 if a bus-switching application is assumed. Thus, for the embodiment illustrated in FIG. 6, the product-term Mux select signals 54 are arranged in sets 54a through 54d of two product-term signals each, thereby resulting in sharing of control signals. For example, product-terms 54a could control four of the 4:1 multiplexers 12 within an I/O block 32 (FIG. 3), set 54b would control another four, and so on. In such an arrangement, the four multiplexers 12 having common Mux select signals 54 cannot be switched independently. Referring back to FIG. 3, each 4:1 Mux 12 for each cell 31 within I/O block 32 receives 4 data signals on data signal paths that are independent from Mux 12 to Mux 12 within I/O block 32. However, each 4:1 Mux 12 within a cell 31 may not have such independence for its control signals (Mux select signals 54). Instead, each 4:1 Mux 12 for each cell 31 within I/O block 32 receives 2 Mux select signals 54 on control signal paths that may be shared among a plurality of multiplexers 12 within I/O block 32.

For the embodiment discussed with respect to FIG. 6, this plurality of multiplexers 12 sharing Mux select signals 54 is four.

Figure 7:
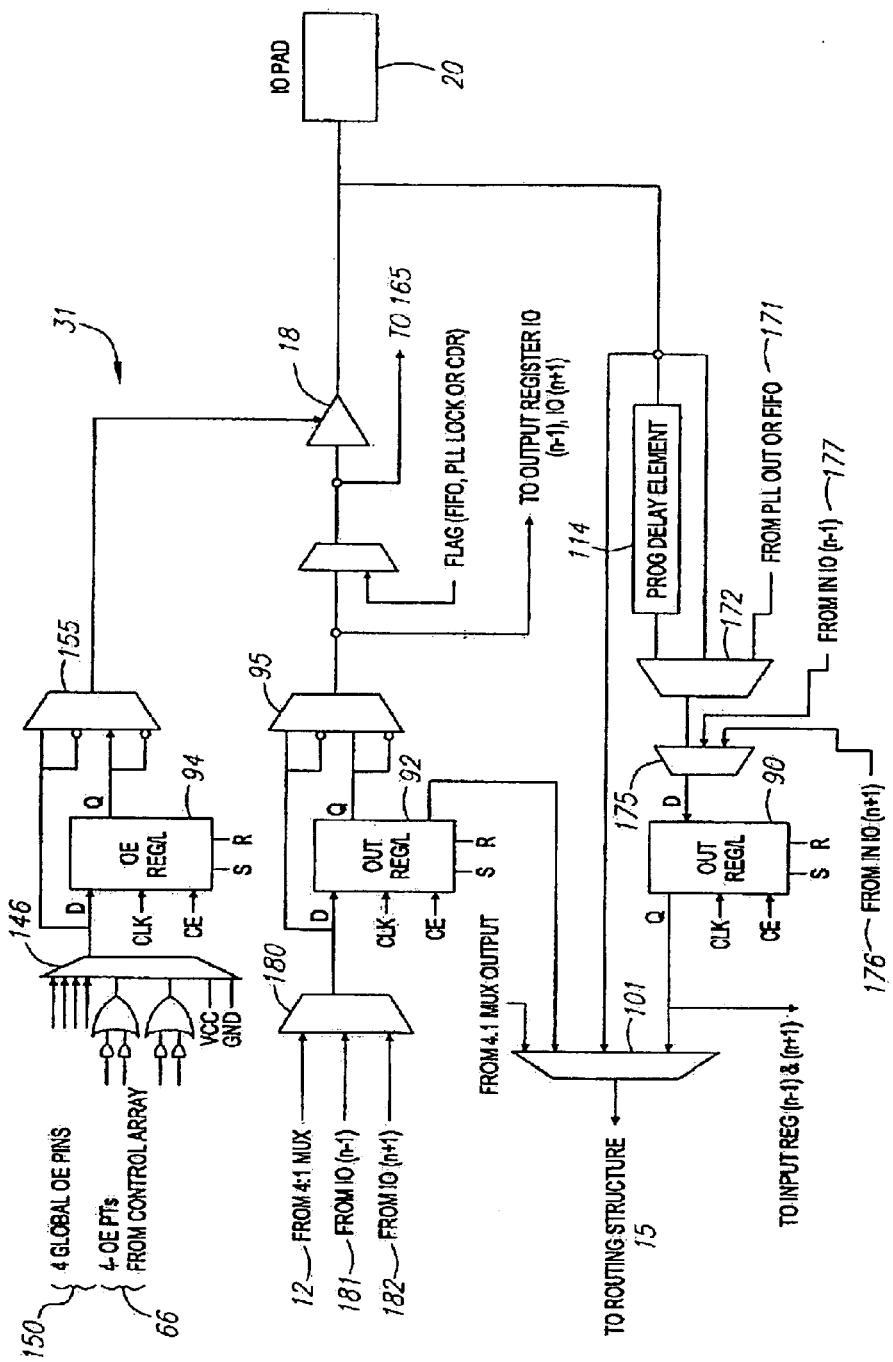
FIG. 7 is a block diagram for an I/O circuit according to one embodiment of the invention.

Turning now to FIG. 7, an embodiment for the I/O circuit 16 of FIG. 3 has its input register 90 and output register 92 separated, thereby providing true bi-directional input and output capabilities. Although such bi-directional capability is advantageous, the block-oriented architecture 30 of the present invention may be implemented without separate input and output registers in I/O circuit 16. Pin 20 transmits to and receives data from programmable interconnect device 25 (FIG. 2) differently depending upon the mode of operation, parallel or serial. How pin 20 receives signals from programmable interconnect device 25 will be described first. In I/O cell 31, an output register bypass Mux 95 selects between either the registered output Q of the output register 92 or the unregistered output of the 4:1 Mux 12. In this fashion, output buffer 18 may receive either a registered or unregistered output signal from output register bypass Mux 95. In addition, the output register bypass Mux 95 provides polarity control for either output signal. To prevent ground bounce, the output of the output register bypass Mux 95 may couple to output buffer 18 through a programmable delay element (not illustrated). In the parallel mode of operation, output buffer 18 provides an output signal, which is either the register or unregistered signal just discussed, to its pin 20. The O output from an OE register 94 controls the output buffer 18 in the following fashion. The data input to the output register 94 receives the output of an OE Mux 146 that selects between the product-term OE signals 66 and four global OE signals 150. Global OE signals 150 route from dedicated OE pins on transmission paths (not illustrated) independent from routing structure 14. OE Mux 145 may also select from either VCC or ground (GND). The Q output from OE Mux 145 couples to bypass multiplexer 155, which may select either the Q output or the unregistered output of OE Mux 146. Accordingly, bypass Mux 155 provides either registered or unregistered control of output buffer 18.

Figure 9:
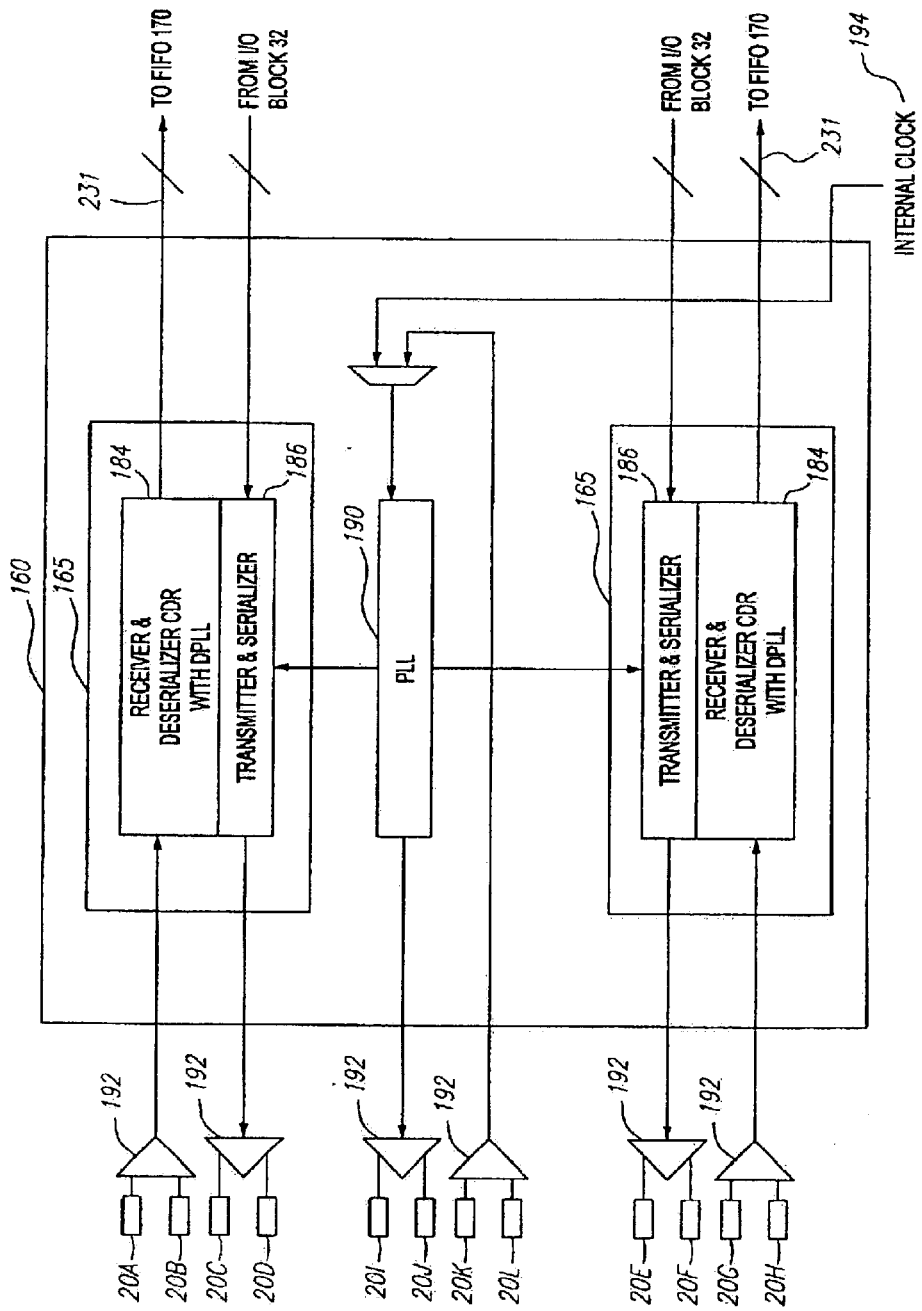
FIG. 9 is a block diagram of a serial interface circuit according to one embodiment of the invention.

In the serial mode of operation, output register bypass Mux 95 may provide an output signal (selected from either the Q output of output register 92 or the unregistered output of 4:1 Mux 12) to its I/O block's SERDES unit 165. When SERDES unit 165 receives this signal from its I/O block 32, SERDES unit 165 functions as a serializer and transmitter of the serial data to pins 20. For example, if SERDES unit 165 is configured for 8B/10B LVDS operation, eight or ten signals originating from eight or ten output register bypass Muxes 95 within a I/O block 32 are received by a parallel bus (not illustrated), which may be implemented as a CMOS/TTL bus, and coupled to the I/O block's SERDES unit 165 on the bus. Thus, SERDES unit 165 receives an 8-bit or 10-bit wide (relatively low speed) data signal and converts the signal to a (relatively high speed) serial data stream. SERDES unit 165 then transmits the serialized data to pins 20c and 20d through differential signal interface 192 (FIG. 9).

The process of how signals are transmitted from pin 20 to programmable interconnect device 25 will now be addressed. In the parallel mode of operation, input register 90 receives an input signal from the pin 20 as follows. Input signals received at pin 20 couple through a programmable delay element 114 to an input selection Mux 172. Mux 172 selects between the output of programmable delay element 114 and signal 171. Signal 171 may be either a global clock signal 105 (FIG. 8) or a bit from the parallel data output of FIFO buffer 170. To receive the input signal from pin 20, input selection Mux 172 is configured to select for the output of programmable delay element 114. Conversely, in the serial mode of operation, input selection Mux 172 selects the output of FIFO buffer 170 so that input register 90 may store a bit of the received serial data decoded by serial interface unit 160.

Regardless of what mode of operation is used to write data to input register 90, the resulting 0 signal from input register 90 couples to its I/O block's routing structure 15 (specifically to first level data-path routing structure 40) through a feedback or input Mux 101. Feedback Mux 101 selects between outputs from the 4:1 Mux 12 (thereby providing a fast feedback path to routing structure 15) and the Q output of input register 90. In addition, feedback Mux 101 may select an unregistered input coupled from pin 20 through programmable delay element 114 or the registered Q output from output register 92.

Because each 4:1 Mux 12 may have the fast feedback path provided by feedback Mux 101, wider multiplexers such as 16:1, 64:1 or even wider may be formed through multiplexer cascading with additional incremental routing structure 15 delays. For example, a 16:1 Mux (not illustrated) can be configured from the outputs of five 4:1 multiplexers 12, resulting in one additional level of routing structure delay. Similarly, a 64:1 Mux (not illustrated) can be configured out of twenty-one 4:1 multiplexers 12, resulting in two additional levels of routing structure delay. The width of the resulting multiplexer is limited only by the supply of 4:1 multiplexers 12 and the levels of delay that can be tolerated. In addition to forming wider multiplexers, the fast feedback path may be used to form larger look-up tables (LUTs). Each 4:1 multiplexer 12 may be configured as a 2-input LUT using its four data inputs. The four data inputs would have to be known values so that the appropriate input may be "looked-up" according to the state of the two product-term multiplexer select signals 54. Using the fast feedback path, four 2-input LUTs (4:1 multiplexers 12) may be combined to form a four-input LUT (not illustrated), resulting in one additional level of routing structure delay.

Figure 8:
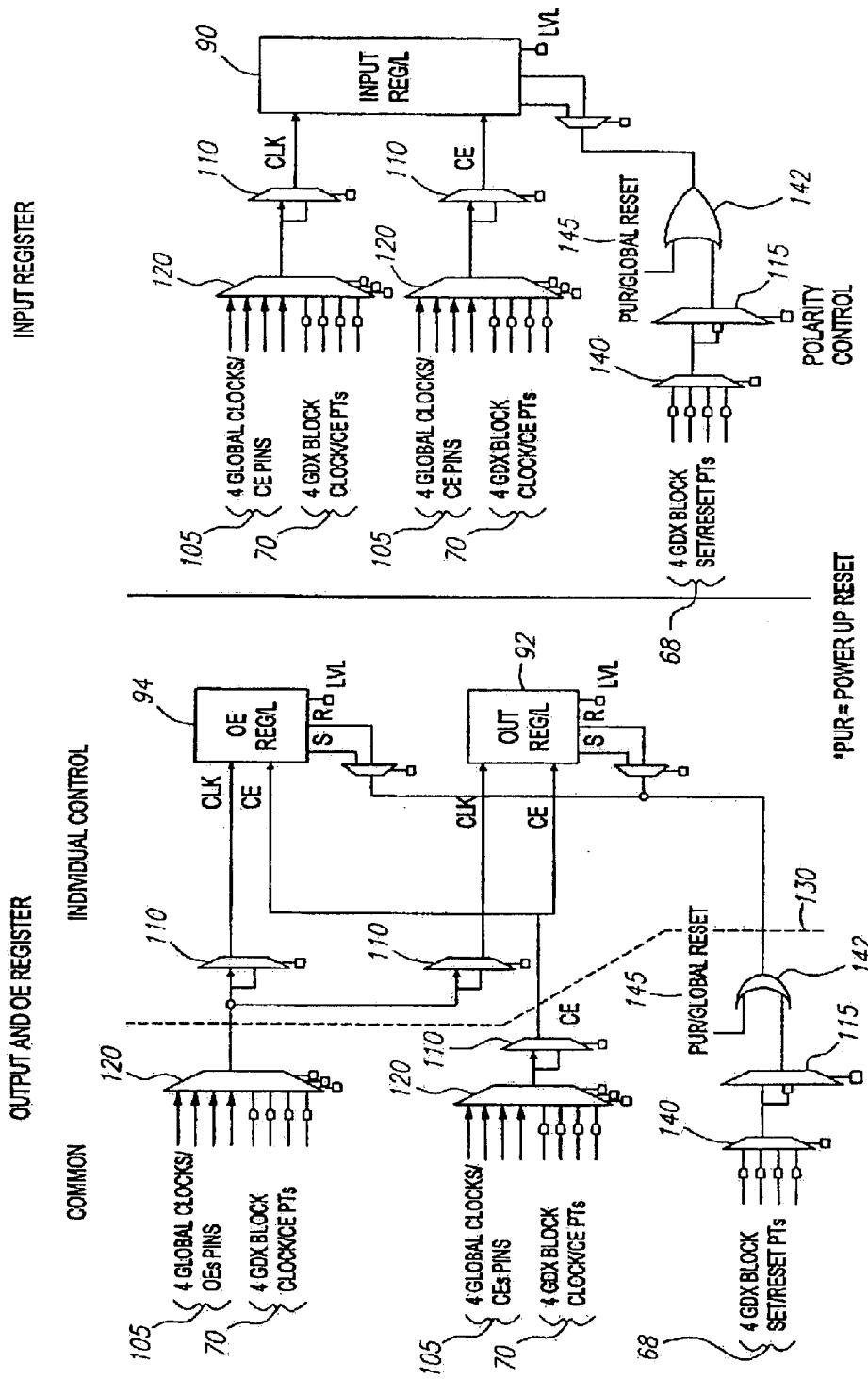
FIG. 8 illustrates the coupling of product-term control signals to the I/O cell of FIG. 7 according to one embodiment of the invention.

Each register 90, 92, and 94 and the 4:1 Mux 12 within the I/O cell 31 receives product-term control signals from the control array 56. The coupling of product term OE signals 70 to output enable register 94 has been described above. The product-term Mux select signals 54 may couple through polarity selection multiplexers 117 to the 4:1 MUX 12. The coupling of the remaining product-term register control signals will now be described with respect to FIG. 8. Turning now to FIG. 8, the coupling of the product-term control signals 62 (FIG. 6) from the control array 56 to the I/O cell's registers is illustrated. As discussed further herein, in addition to the product-term clock and clock enable (CE) signals 70, global clock signals 105 are also distributed to the registers. To control clock skew and permit clock synthesis, each global clock signal 105 is associated with a phase-locked loop (PLL) 100 (FIG. 2). Thus, should there be four global clock signals 105, there will be four PLLs 100. Further details regarding PLLs 100 are described in copending U.S. Application "Programmable Interconnect Circuit With A Phase-Locked Loop," concurrently filed herewith. The global clock signals 105 are distributed to the I/O circuits 16 through a clock tree (not illustrated) independently of the routing structure 14. Clock multiplexers 120 for each register 90, 92, and 94 selects between the global clock signals 105 and the product-term clock and clock enable (CE) signals 70 to provide an input to polarity multiplexers 110, which in turn provide the respective clock and CE inputs to registers 90, 92, and 94. In certain embodiments, a clock MUX 120 may be common to both clock inputs of the OE register 94 and output register 92 to reduce hardware requirements. Similarly, a clock MUX 120 may be common to both CE inputs of the OE register 94 and output register 92. However, as the dashed line 130 indicates, polarity multiplexers 110 provide individual control for the clock inputs to registers 92 and 94 despite their common origin at the clock MUXes 120.

The set and reset input signals for the registers 90, 92, and 94 are selected from the product-term set/reset signals 68 at set/reset multiplexers 140. Polarity multiplexers 115 provide polarity control to the output signals selected by set/reset multiplexers 140. To permit a power-up reset (PUR) or global reset control function, a PUR/global reset signal 145 is ORed with the outputs of the polarity multiplexers 115 at OR gates 142. As described with respect to clock and clock enable signals, output register 92 and output enable register 94 may share the output of a common set/reset multiplexer 140.

The fusing of the routing structure 15 to form the programmable interconnect as well as the configuration of the remaining configurable devices such as, for example, OE Mux 146 and bypass Mux 155, and other multiplexers and switching points may occur through signals stored in non-volatile memory. This non-volatile memory may be in-system programmable.

In-system programmable circuits are discussed, for example, in U.S. Pat. No. 5,237,218 to G. Josephson et al., filed on May 3, 1991 and issued on Aug. 17, 1993. The disclosure of U.S. Pat. No. 5,237,218 is hereby incorporated by its entirety to provide background information regarding in-system programmable circuits. In addition to in-system programmability, the programmable interconnect device disclosed herein may also have boundary scan test capability compliant with IEEE Std. 1149.1 (the "JTAG standard"). The JTAG standard, which is set forth in IEEE Standard Test Access Port and Boundary-Scan Architecture, published by the Institute of Electrical and Electronics Engineers, Inc. (May 1990) is well-known to those in the art.

Figure 10:
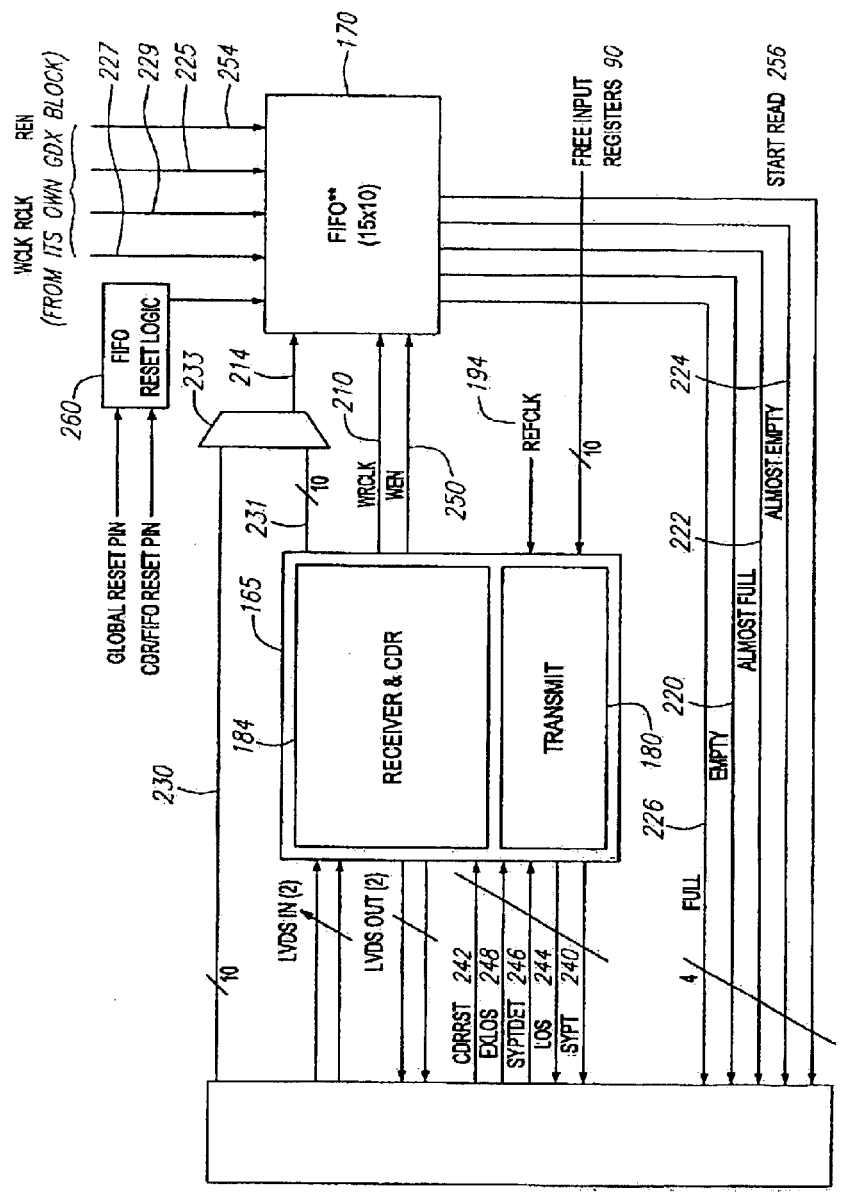
FIG. 10 is a block diagram of a SERDES and FIFO unit within the serial interface circuit of FIG. 9.

Input registers 90 from multiple I/O cells 31 may be chained together to form a shift register. Thus, the D input of input register 90 couples to an input shift register Mux 175. Assuming input register 90 of FIG. 10 is the nth register in the resulting shift register, input shift register Mux 175 may select between the Q output 176 of the (n+1) input register 90 and the Q output 177 of the (n−1) output register 90. The selected output from input shift register Mux 175 becomes the D input for the nth input register 90. In turn, the Q output of the nth input register 90 may be selected as the D input for the (n−1)th and (n+1) th input registers 90.

In an analogous fashion, output registers 92 from multiple I/O cells may be chained together to form a shift register. Assuming output register 92 of FIG. 10 is the nth register in the resulting shift register, an output shift register Mux 180 selects amongst the output of 4:1 Mux 12, and the Q outputs from the (n+1)th and (n−1)th output registers 92. In turn, the Q output of the nth output register 92 may form the D input for the (n+1)th and the (n−1)th output registers 92.

In another embodiment of the invention, the shift registers formed by input registers 90 and output registers 92 may be combined. For example, consider an embodiment having 16 I/O blocks 32, each having 16 I/O circuits 16. The resulting 256 input registers 90 and 256 output registers 92 may be divided into two halves, where one half is denoted the "right half" and the other is denoted as the "left" half. The input registers 92 in the left half, when chained together, form a 128 bit shift register whose stages may be numbered from 0 to 127. Similarly, the input registers 90 in the right half as well as the output registers 92 in either half each form another 128 bit shift register. To chain the input registers 90 and output registers 92 on the left half together, the "zeroth" input register 90 may receive the Q output from the 127$^{th}$ output register 90. Analogously, in the left half, the zeroth output register 92 may receive the Q output from the 127$^{th}$ input register 90. In this fashion, the left half input and output registers 90 and 92 may form a 256 bit shift register.

Similarly, the right hand input registers 90 and output registers 92 may form another 256 bit shift register in an analogous fashion. In addition, shift registers may be combined using routing structure 14. For example, the shift register formed by the left hand side input registers 90 may be combined with the shift register formed by the right hand side output registers 92. In this embodiment, the 127$^{th}$ output register on the right hand side would use the fast feedback provided by feedback Mux 101 to couple its Q output to routing structure 14, which in turn routes this signal to the zeroth input register 90 on the left hand side. Alternatively, all the input registers 90 and output registers 92 in both halves may be chained together using routing structure 14 and pins 20.

Serial interface 160 may be implemented as shown in FIG. 9. It comprises two independent SERDES units 165. In one embodiment, each SERDES unit 165 has a receiver and deserializer unit 184 with clock data recovery and a digital-phase-locked-loop (DPLL) as well as a transmitter and serializer unit 186. The clock data recovery portion (not illustrated) of the receiver 184 may be constructed as described in copending application "DIGITAL PHASE LOCKED LOOP WITH PROGRAMMABLE DIGITAL FILTER, filed Dec. 3, 2001, Ser. No. 10/006,516, concurrently filed herewith, the contents of which are hereby incorporated by reference in their entirety. An analog phase-locked-loop (PLL) 190 receives an internal clock signal 194 (one of the global clock signals 105 shown in FIG. 8) and multiplies internal clock signal 194 to provide a serial data clock for each transmitter unit 186. As described with respect to FIG. 7, I/O block 32 can provide a data word (e.g., 8 to 10 bits wide) for transmission by its serial interface 160. Transmitter 186 serializes the received word and transmits the serialized data at the serial data clock rate to a differential signal interface 192. Each differential signal interface 192 may receive a serial data stream and convert the received serial data stream into a differential signal. Conversely, a differential signal interface 192 may receive a differential signal and convert the differential signal into a serial data stream. Differential signal interface 192 may be implemented as an application specific integrated circuit (ASIC) component. Differential signal interface 192 may be configured to operate according to an LVDS, NLVDS, BLVDS, or LVPECL protocol. Because differential signal interface 192 may produce a differential signal that requires two conductors for its expression, each transmitter 186 will communicate with two pins 20 through its differential signal interface 192. For example, transmitter 186 in one SERDES 165 couples to pins 20c and 20d while transmitter 186 in the other SERDES 165 couples to pins 20g and 20h. Similarly, receiver 184 in one SERDES 165 couples to pins 20a and 20b while receiver 184 the other SERDES 165 couples to pins 20g and 20h. Each receiver 184 may provides a data word to its FIFO 170 upon deserializing the serial data stream received from its differential signal interface 192. Should differential interface units 192 be configured for operation in an NLVDS protocol, PLL 190 need not generate a serial data signal clock from internal clock 194. Instead, a differential serial data clock is transmitted over pins 20k and 201 to a differential signal interface unit 192, which in turn provides a serial data clock signal to PLL 190. PLL 190 may then provide the received serial data clock signal to its receivers 184. In an NLVDS transmission (rather than reception mode), PLL 190 would provide an NLVDS clock signal to a differential signal interface unit 192, which in turn provides an NLVDS differential clock signal to its pins 20i and 20j. Multiple transmitters 186 or receivers 184 associated with an NLVDS clock signal assist in the transmission or reception of an n-bit NLVDS data word. During NLVDS operation, the digital-phase-locked-loop associated with each receiver 184 may be used for board/cable skew cancellation in a calibration mode, which is enabled by a chip level input denoted as CALIB (not illustrated). Regardless of the particular differential signal protocol implemented, receiver 184 may provide a parallel data stream to its FIFO 170 on bus 231 in the serial mode. FIFO 170 may also operate as a generic FIFO in which it receives the parallel data stream directly from its pins 20. Turning now to FIG. 10, a multiplexer 233 selects between the parallel data stream carried on bus 231 from receiver 184 and the parallel data stream coupled directly from pins 20. FIFO 170 receives the output of multiplexer 233 on bus 214.

Proper operation of a SERDES unit 165 with a FIFO 170 requires a number of flags. The flag signal flow among SERDES 165, FIFO 170, and pins 20 is illustrated in FIG. 10. The CDR unit (not illustrated) within receiver 184 must not only identify the bits in its received serial bit stream using the recovered serial data clock but also identify the beginning/end of a data word within the serial bit stream. As is known in the art, each CDR unit may do so by employing pattern recognition techniques. A CDR flag, SYPT 240, is used in 10B/12B LVDS operation in conjunction with pattern recognition. A CDR reset flag, CDRRST 242, resets the CDR unit to start a lock in process, regardless of whether LVDS, NLVDS, or BLVDS operation is supported. Another flag, loss of signal (LOS) 244, indicates when receiver 184 loses its signal during 10B/12B LVDS operation. Alternatively, LOS 244 may indicate when receiver 184 loses synchronization during NLVDS operation. Another flag, SYPTDET 246 is optional for 10B/12B LVDS operation. Finally, a EXLOS flag 248 originates from an external optic LOS detector (not illustrated) used in NLVDS operation. Another flag, CAL (not illustrated), is used to enable CDR calibration. It will be appreciated that the number and type of CDR flags used may vary and will depend upon design choices known to those in skilled in the art. With respect to the embodiment illustrated in FIG. 10, 6 pins 20 will be dedicated within each I/O block 32 for carrying the just-described flags during serial mode operation. In addition, four pins (e.g., 20a, 20b, 20c, and 20d of FIG. 9) are dedicated to LVDS input and output differential signals.

Having deserialized the received serial data, each receiver 184 may provide a data word to its FIFO 170. For example, if pins 20a and 20b receive a differential signal encoded using an 8B/10B LVDS protocol, receiver 184 provides a 10-bit word to FIFO 170. FIFO 170 allows clock synchronization between the serial data clock associated with the LVDS serial data stream and internal clock 194. Thus, FIFO 170 need not be large and may be implemented as a 15 deep, 10 bit wide FIFO. Because of its clock synchronization function, FIFO 170 may be implemented as a simple "Circular Queue" in a round-robin fashion with two separate clocks, a read clock and a write clock. FIFO 170 may be either synchronous (common clock) or asynchronous (separate clock). A FIFO 170 that is 15 words deep by 10 bits wide can support 8B/10B or 10B/12B LVDS protocols as well as an NLVDS protocol. Depending upon the programming of interconnect device 25, each FIFO 170 may operate in three different modes:

1) support for LVDS CDR. serial mode operation.

2). Generic FIFO in which the LVDS CDR functionality in receivers 184 is bypassed. As described above, FIFO 170 receives a 10 bit data word from SERDES 165 in serial mode. In such a mode, ten pins 20 are used to transmit a 10 bit word (assuming a 10-bit-wide FIFO). FIFO 170 couples to these pins to directly to receive the data word. This coupling occurs through multiplexer 233 as explained herein.

3). By-pass mode in which the LVDS CDR functionality is used but FIFO 170 acts a flow-through device for the parallel data stream resulting from receiver 184.

Figure 11:
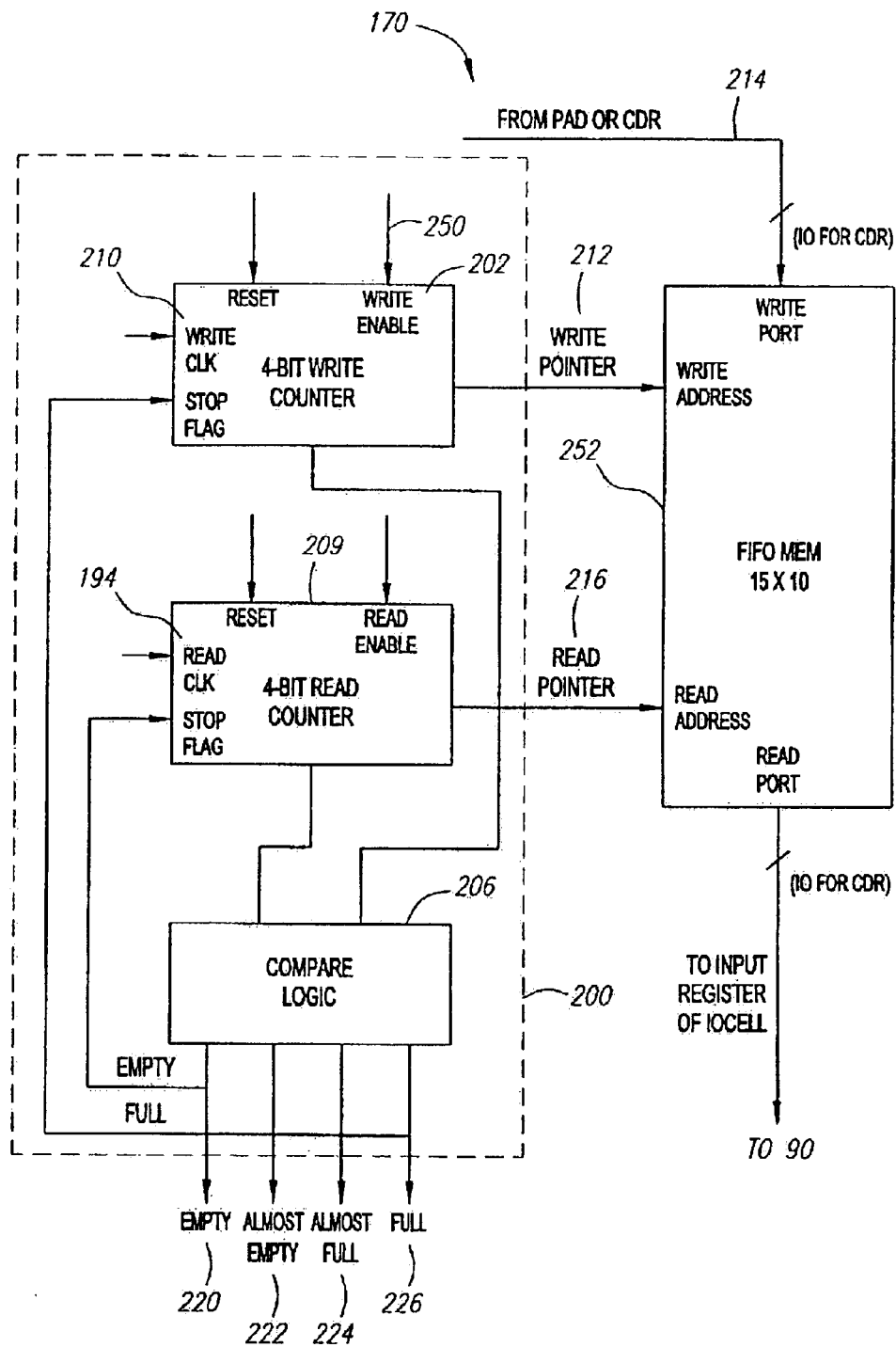
FIG. 11 is a block diagram illustrating further details of the FIFO unit of FIG. 10.

Should FIFO 170 be used in either of the first two modes, FIFO flags assist in its operation. Turning now to FIG. 11, a FIFO flag generation circuit 200 is illustrated having a write counter 202, a read counter 204, and compare logic 206. Assuming FIFO 170 is constructed to be just 15 words deep, write counter 202 and read counter 204 need be just 4 bits each. CDR unit in receiver 184 (FIG. 9) will produce a serial data clock recovered from the clock-encoded serial data stream using its DPLL. This serial data clock may be translated by receiver 184 to produce a write clock signal 210 that signals when a 10 bit word will be written to FIFO 170. In addition, receiver 184 also produces a write enable signal 250 in conjunction with producing write clock signal 210. Write counter 202 receives write clock signal 210 and increments its write pointer 212 accordingly if write enable signal 250 is true. A memory array 252 within FIFO 170 receives write pointer 212 so that a 10 bit word carried on bus 214 (should interconnect device 25 be in the parallel mode, the 10 bit word is received from pins 20, alternatively should interconnect device 25 be in the serial mode, the 10 bit word is received from receiver 184) may be written into the word position indicated by write pointer 212.

Read counter 204 receives internal clock signal 194 as its read clock signal and increments its read pointer 216 accordingly if a read enable signal 254 (received from I/O block 32) is true. In addition, I/O block 32 may provide a write enable signal 225, a write clock signal 227 and a read clock signal 229. Memory array 252 receives read pointer 216 and outputs the 10 bit word pointed to by read pointer 216 to input registers 90 (FIG. 7) in I/O block 32. Compare logic 206 receives both pointers 212 and 216 and adjusts an empty flag 220, almost empty flag 222, almost full flag 224, and full flag 226 accordingly. Full flag goes true when FIFO 170 is full. Full flag 226 may be synchronous with the rising edge of the write clock 210. Thus, if full flag 226 goes true and data be subsequently read from FIFO 170, opening up a word slot in FIFO 170, full flag 226 will not be reset until the next rising edge of write clock 210. Should full flag 226 become true, write counter 202 stops operation.

Empty flag 220 goes true when FIFO 170 stores no data. Empty flag 220 may be synchronous with the rising edge of read clock (internal clock 194). Thus, if empty flag goes true and data be subsequently written to FIFO 170, empty flag 220 will not be reset until the next rising edge of internal clock 194. If empty flag 220 is true, read counter 204 stops operation. Because FIFO 170 may be quite small (just 15 words deep), almost empty flag 222 and almost full flag 224 may be of limited usage when FIFO 170 is in a generic FIFO mode.

As described above, each FIFO 170 is associated with four flag signals. An additional flag signal, start read flag 256, is associated with CDR operation. Multiple FIFOs 170 may be combined by ensuring that all FIFOs 170 have the same write clock 210 and read clock (internal clock 194). As with respect to the CDR flags, the number and type of FIFO flags implemented may vary and will depend upon design considerations known to those of skill in the art. A reset logic block 260 couples to a global RESET pin and a CDR/FIFO RESET pin and provides a reset signal to memory array 252. Should the signal on either of these pins be high, FIFO 170 resets.

Figure 12:
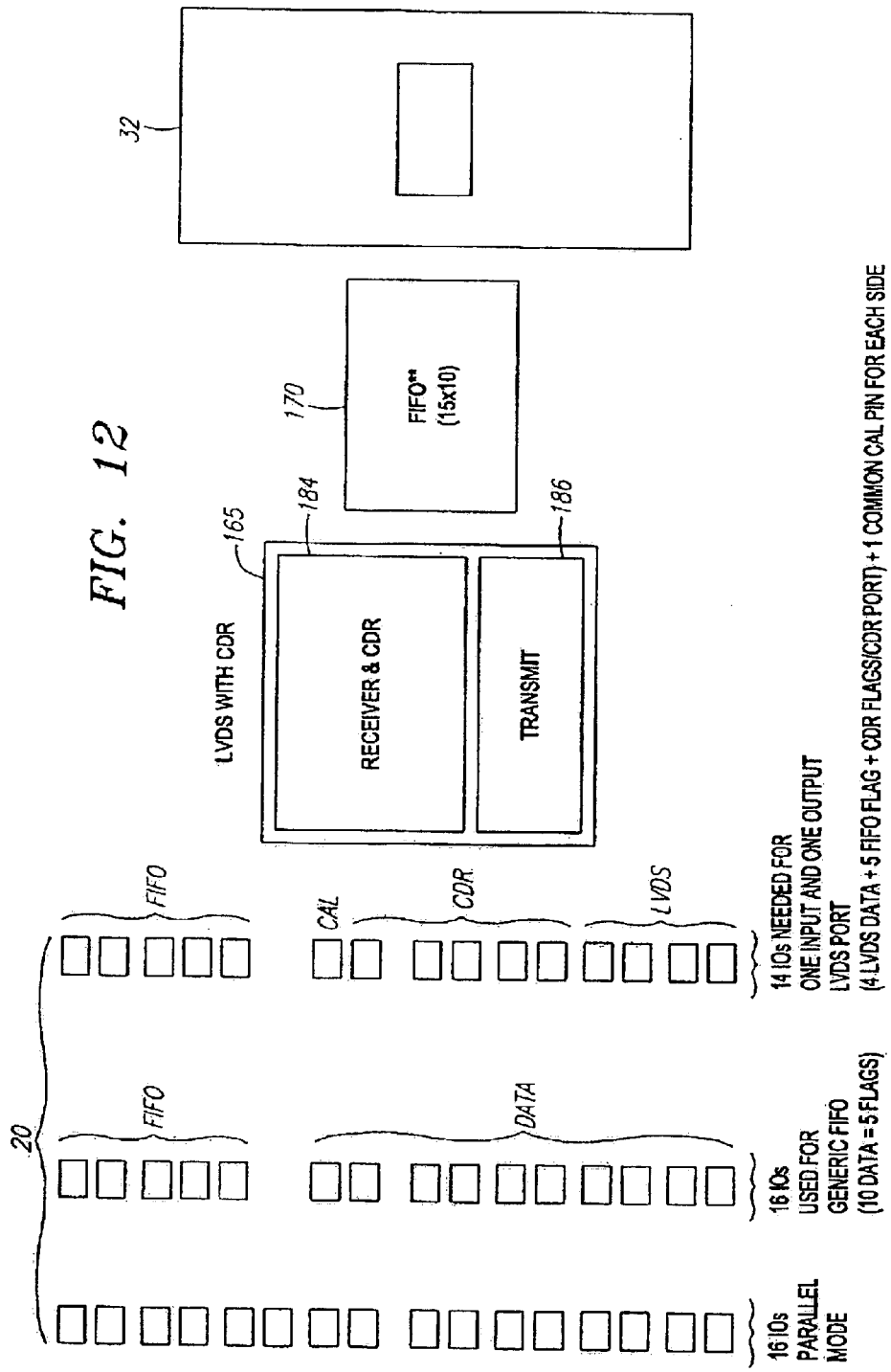
FIG. 12 illustrates the relationships between an I/O block's SERDES and FIFO unit and its 110 pins.

Turning now to FIG. 12, the assignment for an I/O block's sixteen pins 20 according to mode of operation is illustrated. In a parallel mode, all 16 pins 20 communicate with their respective input and output registers in I/O block 32 as discussed with respect to FIG. 7. In this mode of operation, the I/O block's SERDES unit 165 and FIFO 170 are bypassed. In the generic FIFO mode, 5 pins 20 are used to carry the above-described FIFO flags. Assuming a 10-bit wide FIFO 170, 10 pins 20 receive a 10-bit data word and couple the data word over bus 230 (FIG. 10), which bypasses SERDES 165, to FIFO 170. Thus, in generic FIFO mode, 15 pins are used. Finally, in the serial mode, 11 pins carry the above-described CDR flags, CAL signal (used only for NLVDS operation), and FIFO flags. Four pins are dedicated to input and output LVDS signal, respectively. Thus in the serial mode, up to 15 pins are used also. Before data can be transmitted or received by SERDES 165, both the receiver 184 and transmitter 186 should be initialized. This initialization involves the synchronization of the serializer in transmitter 186 and the DPLL in receiver 184 to the internal clock signal 194.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. A programmable semiconductor device, comprising:
   at least one input/output (I/O) pin;
   an I/O block;
   a high speed interface coupled between the I/O block and the at least one I/O pin; and
   a first-in, first-out (FIFO) buffer coupled between the high speed interface and the I/O block,
   the high speed interface operable to convert a serial stream of data signals received from the at least one I/O pin into a parallel data stream, the FIFO buffer operable to receive the parallel data stream from the high speed interface and to route the parallel data stream to the I/O block.

2. The programmable semiconductor device of claim 1, wherein the I/O block includes a plurality of related I/O cells.

3. The programmable semiconductor device of claim 2, wherein the I/O cells within the I/O block share common signal paths.

4. The programmable semiconductor device of claim 2, wherein the I/O block includes a control array coupled to the I/O cells within the I/O block.

5. The programmable semiconductor device of claim 1, wherein the FIFO buffer is operable to receive from the high speed interface a write clock signal derived from a clock signal recovered from the serial data stream for controlling the frequency at which the parallel data stream is written from the high speed interface into the FIFO buffer and to receive from the I/O block a read clock signal for controlling the frequency at which data is read from the FIFO buffer for the I/O block.

6. The programmable semiconductor device of claim 5, wherein the FIFO buffer includes:
   a FIFO memory operable to receive the parallel data stream;
   a write pointer generator coupled to the FIFO memory and responsive to the write clock signal, the write pointer generator generating a write pointer indicating where in the FIFO memory a next word of the parallel data stream is to be written to; and
   a read pointer generator coupled to the FIFO memory and responsive to the read clock signal, the read pointer generator generating a read pointer indicating where in the FIFO memory a next word of the parallel data stream is to be read from.

7. The programmable semiconductor device of claim 1, wherein the FIFO buffer is operable to receive the parallel data stream from the high speed interface at a first frequency and to transmit the parallel data stream to the I/O block at a second frequency.

8. The programmable semiconductor device of claim 1, wherein the high speed interface is programmable to recognize the data format of the serial data stream as one of a number of serial data formats.

9. The programmable semiconductor device of claim 8, wherein the high speed interface is programmable through a plurality of programmable non-volatile memory cells.

10. The programmable semiconductor device of claim 1, wherein the high speed interface comprises a serializer/deserializer with clock data recovery.

11. The programmable semiconductor device of claim 1, wherein the high speed interface comprises:
   a first serializer/deserializer with clock data recovery;
   a second serializer/deserializer with clock data recovery; and
   a phase locked loop coupled to both serializer/deserializers;
   each serializer/deserializer coupled between a separate I/O block and a separate I/O pin.

12. The programmable semiconductor device of claim 1 including a differential signal interface coupled between a pair of I/O pins and the high speed interface, the differential signal interface operable to receive a differential signal from the pair of pins and to convert the differential signal into the serial data stream.

13. The programmable semiconductor device of claim 1 including a plurality of I/O blocks and routing structures, wherein each block is associated with a corresponding routing structure and the parallel data stream is routed to an I/O block through the corresponding routing structure.

14. The programmable semiconductor device of claim 1, wherein the at least one I/O pin, I/O block, high speed interface, and FIFO buffer are coupled in an arrangement that provides for multiple modes of operation including a first mode wherein the high speed interface converts the serial data stream into a parallel data stream and routes the parallel data stream to the FIFO buffer; and a second mode wherein the serial data stream is routed from the at least one I/O pin to the FIFO buffer, bypassing the high speed interface.

15. The programmable semiconductor device of claim 14, wherein the multiple modes of operation include a third mode wherein the high speed interface converts the serial data stream into a parallel data stream and routes the parallel data stream to the I/O block, bypassing the FIFO buffer; and a fourth mode wherein the serial data stream is routed from the at least one I/O pin to the I/O block, bypassing the high speed interface and the FIFO buffer.

16. The programmable semiconductor device of claim 14 including a plurality of programmable non-volatile memory cells operable to operate the device in the multiple modes.

17. A method of transferring data from an I/O pin of a programmable semiconductor device to an I/O cell therein, comprising:

provoking a plurality of selectable signal paths corresponding to different operating modes of the device, the plurality including a first path from the I/O pin through a high speed interface and FIFO buffer to the I/O cell; and a second path from the I/O pin through the FIFO buffer to the I/O cell, bypassing the high speed interface;

responsive to selection of an operating mode, selecting the corresponding signal path; and responsive to data received at the I/O pin, transferring the data to the I/O cell along the selected path in accordance with the selected operating mode.

18. The method of claim 17, wherein the plurality of selectable signal paths includes a third path from the I/O pin through the high speed interface to the I/O cell, bypassing the FIFO buffer; and a fourth signal path from the I/O pin to the I/O cell, bypassing the high speed interface and FIFO buffer.

19. A programmable semiconductor device, comprising:

an input/output (I/O) pin;

an I/O cell;

a high speed interface coupled between the I/O cell and the I/O pin, the high speed interface operable to convert a serial stream of data signals received from the I/O pin into a parallel data stream;

a first-in, first-out (FIFO) buffer coupled between the high speed interface and the I/O cell, the FIFO buffer operable to receive the parallel data stream from the high speed interface and to route the parallel data stream to the I/O cell;

a first selectable signal path from the I/O pin through the high speed interface and FIFO buffer to the I/O cell; and a second selectable signal path from the I/O pin through the FIFO buffer to the I/O cell, bypassing the high speed interface.

20. The programmable semiconductor device of claim 19, including:

a third selectable signal path from the I/O pin through the high speed interface to the I/O cell, bypassing the FIFO buffer; and a fourth selectable signal path from the I/O pin to the I/O cell, bypassing the high speed interface and FIFO buffer.

* * * * *